United States Patent
Yang et al.

(10) Patent No.: US 11,870,004 B2
(45) Date of Patent: Jan. 9, 2024

(54) METAL OXIDE NANOPARTICLES SURFACE-TREATED WITH METAL ION, QUANTUM DOT-LIGHT-EMITTING DEVICE COMPRISING THE SAME AND METHOD FOR FABRICATING THE SAME

(71) Applicant: HONGIK UNIVERSITY INDUSTRY-ACADEMIA COOPERATION FOUNDATION, Seoul (KR)

(72) Inventors: Hee-Sun Yang, Seoul (KR); Chang-Yeol Han, Seoul (KR)

(73) Assignee: HONGIK UNIVERSITY INDUSTRY-ACADEMIA COOPERATION FOUNDATION, Seoul (KR)

( * ) Notice: Subject to any disclaimer, the term of this patent is extended or adjusted under 35 U.S.C. 154(b) by 771 days.

(21) Appl. No.: 16/817,162

(22) Filed: Mar. 12, 2020

(65) Prior Publication Data
US 2020/0321490 A1   Oct. 8, 2020

(30) Foreign Application Priority Data

Apr. 8, 2019   (KR) .................. 10-2019-0041066

(51) Int. Cl.
*H01L 33/06*   (2010.01)
*H01L 33/30*   (2010.01)
(Continued)

(52) U.S. Cl.
CPC .............. *H01L 33/00* (2013.01); *B82Y 20/00* (2013.01); *H01L 25/0753* (2013.01);
(Continued)

(58) Field of Classification Search
CPC . H01L 33/0062; H01L 33/06; H01L 25/0753; H01L 33/30; H01L 2933/0033; H10K 50/115; B82Y 20/00
See application file for complete search history.

(56) References Cited

U.S. PATENT DOCUMENTS

| | | | |
|---|---|---|---|
| 2005/0223969 A1* | 10/2005 | Chen | ........................ C30B 29/16 117/105 |
| 2017/0038326 A1* | 2/2017 | Motayed | ............ G01N 33/0047 |
| 2019/0273214 A1* | 9/2019 | Li | ........................ H01L 51/5064 |

OTHER PUBLICATIONS

Meng et al., "Effect of annealing atmosphere on the electrical and optical properties of sol-gel derived Al doped Zn1—xMgxO thin film", Thin Solid Films 597—7 pages (Nov. 10, 2015).
(Continued)

*Primary Examiner* — Savitri Mulpuri
(74) *Attorney, Agent, or Firm* — Knobbe, Martens, Olson & Bear, LLP

(57) ABSTRACT

The metal oxide nanoparticle includes a Zn-containing metal $Me^1$ oxide nanoparticle of $Zn_{1-x}Me^1_xO$ ($0 \leq x \leq 0.5$) composition, and a metal $Me^2$ ion surface treatment layer formed on a surface of the nanoparticle. Here, the metal $Me^1$ is any one selected from Li, Be, Na, Mg, Al, K, Ca, Ti, V, Cr, Mn, Fe, Co, Ni, Cu, Ga, Ge, Rb, Sr, Zr, Nb, Mo, Ru, Rh, Pd, Ag, In, Sn, Sb, Ba and a combination thereof, and the metal $Me^2$ is any one selected from Li, Be, Na, Mg, Al, K, Ca, Ti, V, Cr, Mn, Fe, Co, Ni, Cu, Zn, Ga, Ge, Rb, Sr, Zr, Nb, Mo, Ru, Rh, Pd, Ag, In, Sn, Sb, Ba and a combination thereof.

17 Claims, 11 Drawing Sheets

(51) Int. Cl.
H01L 33/00 (2010.01)
H01L 25/075 (2006.01)
B82Y 20/00 (2011.01)

(52) U.S. Cl.
CPC .......... H01L 33/0062 (2013.01); H01L 33/30 (2013.01); *H01L 2933/0033* (2013.01)

(56) References Cited

OTHER PUBLICATIONS

Sun et al., "Bright, multicoloured light-emitting diodes based on quantum dots", Nature Photonics, vol. 1—6 pages (Dec. 2007).
Wood et al., "Selection of Metal Oxide Charge Transport Layers for Colloidal Quantum Dot LEDs", ACS Nano, vol. 3, No. 11—6 pages (2009).
Qian et al., "Stable and efficient quantum-dot light-emitting diodes bases on solution-processed multilayer structures", Nature Photonics, vol. 5—6 pages (Sep. 2011).
Cao et al., "A Layer-by-Layer Growth Strategy for Large-Size InP/ZnSe/ZnS Core-Shell Quantum Dots Enabling High-Efficiency Light-Emitting Diodes", Chemistry of Materials, vol. 30, No. 21—9 pages (Nov. 2018).

\* cited by examiner

METAL OXIDE NANOPARTICLES SURFACE-TREATED WITH METAL ION, QUANTUM DOT-LIGHT-EMITTING DEVICE COMPRISING THE SAME AND METHOD FOR FABRICATING THE SAME

RELATED APPLICATIONS

The present application claims the benefit of Korean Patent Application No. 10-2019-0041066 filed on Apr. 8, 2019 with the Korean Intellectual Property Office, the disclosure of which is incorporated herein by reference in its entirety.

TECHNICAL FIELD

The present disclosure relates to a light-emitting device, and more particularly, to a quantum dot light-emitting diode (OLED) whose material is changed to have higher luminance and efficiency and a method for fabricating the same.

BACKGROUND ART

A colloidal semiconductor nanocrystal called a quantum dot (QD) emits light as an electron in an unstable state moves from the conduction band to the valence band, and as QDs are smaller in size, they emit shorter wavelength light. This is unique electrical and optical properties that are different from those of the existing semiconductor material, and QDs are easy to modify the fluorescent emission wavelength through size adjustment or alloying/doping introduction. In addition, with the continuous development of synthesis methods, fluorescent emission of QDs is satisfactorily efficient in terms of practical device applications. Thus, QDs are regarded as an active material that can replace rare earth element-doped bulk phosphor and fluorescent/phosphorescent polymer in the manufacture of LEDs.

There are color-conversion technology and electroluminescence (EL) technology used to apply QDs to displays. Currently, color-conversion based displays are commercially available, but electroluminescent QD based displays are ultimately pursued. In the same way as the existing organic light-emitting diode (OLED), electroluminescent QLEDs use QDs, not organics, in an emitting layer. OLEDs produce a single color such as white, red, blue according to the device type, but cannot produce various colors of light. In contrast, QLEDs produce a desired natural color by adjusting the size of QDs, and thus they gain attention as a next-generation light source that can overcome the disadvantages of LEDs due to their high color reproducibility and luminance that is as high as LEDs.

In general, QLEDs have a multilayer structure between an anode and a cathode, including an emitting layer (EML), a hole injection layer (HIL) and a charge transport layer (CTL) such as a hole transport layer (HTL) and an electron transport layer (ETL) to easily inject electrons and holes into the QD EML. The performance of QLEDs are greatly affected by the efficiency of radiative recombination of exciton that is an electron-hole pair composed of an electron and a hole in pair injected into the QD EML. When an excess of electrons or holes are injected into the QD EML, causing charge imbalance, Auger recombination occurs. Auger recombination is a nonradiative process where energy from light through radiative recombination of exciton is transferred to free charge. Since balanced charge injection into the QD EML is important for the device performance, the performance of QLEDs has been improved with the help of quality improvement of QDs and development of the CTL.

In the early stage, QLED structures used organics for the entire CTL, and Sun et al. reported that green, yellow, orange and red QLEDs were each fabricated using poly(N,N'-bis(4-butylphenyl)-N,N'-bis(phenyl)benzidine)(poly-TPD) organic HTL and tris-(8-hydroxyquinoline) aluminum ($Alq_3$) organic ETL, and the red device showed the maximum luminance of 10064 $cd/m^2$ and the current efficiency of 2.8 cd/A [Q. Sun, Y. A. Wang, L. S. Li, D. Wang, T. Zhu, J. Xu, C. Yang, Y. Li, Nat. photonics 2007, 1, 717].

Sputter-deposited CTL (p-type NiO HTL and n-type zinc tin oxide ETL) was used in place of the organic CTL, but all these inorganic devices showed low External Quantum efficiency (EQE)(<0.2%) [V. Wood, M. J. Panzer, J. E. Halpert, J. M. Caruge, M. G. Bawendi, V. Bulovic, ACSNano 2009, 3, 3581].

The introduction of hybrid CTL including organic HTL and inorganic ETL brought a dramatic improvement in QLED performance. Holloway group fabricated hybrid QLEDs including poly-TPD HTL and ZnO nanoparticle ETL, and the maximum EQE of 1.8% was reported [L. Qian, Y. Zheng, J. Xue, P. H. Holloway, Nat. photonics 2011, 5, 543].

Note should be taken of the exclusive use of highly fluorescent Cd-based II-VI QDs in all the above-described QLEDs. It is reported that harmful Cd-containing QD based QLEDs show high external quantum efficiency, whereas non-Cd QD QLEDs shows low external quantum efficiency of about 6% in the red and green regions [F. Cao, S. Wang, F. Wang, Q. Wu, D. Zhao, X. Yang, Chem. Mater. 2018, 30, 8002].

The disclosure of this section is to provide background information relating to the invention. Applicant does not admit that any information contained in this section constitutes prior art.

DISCLOSURE

The present disclosure is directed to providing an improved electron transport layer material and a method for fabricating the same.

The present disclosure is further directed to providing a quantum dot light-emitting diode including an improved electron transport layer for higher luminance and efficiency and a method for fabricating the same.

An improved electron transport layer material according to the present disclosure is a metal oxide nanoparticle as described below. The metal oxide nanoparticle includes a Zn-containing metal $Me^1$ oxide nanoparticle of $Zn_{1-x}Me^1_xO$ ($0 \leq x \leq 0.5$) composition, and a metal $Me^2$ ion surface treatment layer formed on a surface of the nanoparticle. Here, the metal $Me^1$ is any one selected from Li, Be, Na, Mg, Al, K, Ca, Ti, V, Cr, Mn, Fe, Co, Ni, Cu, Ga, Ge, Rb, Sr, Zr, Nb, Mo, Ru, Rh, Pd, Ag, In, Sn, Sb, Ba and a combination thereof, and the metal $Me^2$ is any one selected from Li, Be, Na, Mg, Al, K, Ca, Ti, V, Cr, Mn, Fe, Co, Ni, Cu, Zn, Ga, Ge, Rb, Sr, Zr, Nb, Mo, Ru, Rh, Pd, Ag, In, Sn, Sb, Ba and a combination thereof.

The metal $Me^2$ ion surface treatment layer may be formed by reaction of the metal $Me^2$ with dangling bond on the surface of the Zn-containing metal $Me^1$ oxide nanoparticle.

The metal $Me^2$ ion surface treatment layer may include $Me^2$-OH.

The metal $Me^2$ ion surface treatment layer may be $Me^2(OH)_2$. That is, the metal $Me^2$ ion surface treatment layer may be a layer of hydroxide of the corresponding metal $Me^2$ ion.

The metal oxide nanoparticle may have lower electron mobility than the Zn-containing metal $Me^1$ oxide nanoparticle by the metal $Me^2$ ion surface treatment layer.

A quantum dot light-emitting device according to the present disclosure includes an electron transport layer including the metal oxide nanoparticle according to the present disclosure. The quantum dot light-emitting device may further include an anode, a hole injection layer, a hole transport layer, a quantum dot emitting layer and a cathode, and the hole transport layer and the hole injection layer may be any one selected from poly(ethylenedioxythiophene):polystyrene sulphonate (PEDOT:PSS), poly[(9,9-dioctylfluorenyl-2,7-diyl)-co-(4,4'-(N-(p-butylphenyl))diphenylamine)] (TFB), poly(9-vinylcarbazole) (PVK), N,N,N',N'-tetrakis(4-methoxyphenyl)-benzidine (TPD), poly-TPD, 4,4',4"-tris(N-carbazolyl)-triphenylamine (TCTA), N,N'-bis(naphthalen-1-yl)-N, N'bis(phenyl)-9,9-spiro-bifluorene (spiro-NPB), dipyrazino[2,3-f:2',3'-h]quinoxaline-2,3,6,7,10,11-hexacarbonitrile (HATCN), 1,1-bis[(di-4-tolylamino)phenylcyclohexane (TAPC), p-type metal oxide and a combination thereof.

The quantum dot emitting layer may include Group II-VI, I-III-VI or III-V nano semiconductor compound.

The metal oxide nanoparticle may include a Zn-containing Mg oxide nanoparticle of $Zn_{1-x}Mg_xO$ ($0 \leq x \leq 0.5$) composition, and a Mg ion surface treatment layer formed on a surface of the nanoparticle.

The Mg ion surface treatment layer may include Mg—OH.

The Mg ion surface treatment layer may be $Mg(OH)_2$.

The present disclosure further provides a method for fabricating a quantum dot light-emitting diode.

In this method, the quantum dot emitting layer and the electron transport layer may be formed by a solution process. The metal oxide nanoparticle according to the present disclosure may be fabricated by the method including forming a Zn-containing metal $Me^1$ oxide nanoparticle of $Zn_{1-x}Me^1_xO$ ($0 \leq x \leq 0.5$) composition, and forming a metal $Me^2$ ion surface treatment layer by metal $Me^2$ ion surface treatment on a surface of the nanoparticle.

The step of forming the metal $Me^2$ ion surface treatment layer may be performed by forming the Zn-containing metal $Me^1$ oxide nanoparticle in a solution, and injecting a precursor of the metal $Me^2$ into the solution to cause reaction.

The precursor of the metal $Me^2$ may be a metal salt material including the metal $Me^2$. Examples of the metal salt material may include metal oxide, metal fluoride, metal chloride, metal bromide, metal iodide, metal acetylacetonate, metal nitrate, metal acetate or a metal carboxylate salt. A metal alkoxide material may be also used. Its examples may include metal isopropoxide, metal ethoxide or metal tert-butoxide.

In a specific example, the metal oxide nanoparticle is fabricated by adding a transparent solution including tetramethylammoniumhydroxide (TMAH) and ethanol to a solution of cation in dimethyl sulfoxide (DMSO) including Zn acetate dehydrate and Mg acetate tetrahydrate to cause reaction, and additionally injecting Mg acetate tetrahydrate to cause further reaction to form a Mg ion surface treatment layer on Zn-containing Mg oxide nanoparticle of $Zn_{1-x}Mg_xO$ ($0 \leq x \leq 0.5$) composition through a continuous process, followed by precipitation.

The metal ions used in the surface treatment (in the previous example, Mg) are rich on the surface of the metal oxide nanoparticle fabricated by this method (in the previous example, ZnMgO), i.e., at a higher concentration than the inner side.

Here, the temperature condition is not very important in the metal $Me^2$ ion surface treatment, and the reaction time condition affects the metal $Me^2$ ion content on the surface of the nanoparticle, and thus it may be necessary to manage the reaction time condition. To increase the reaction time, aging may be performed.

As the metal oxide nanoparticle according to the present disclosure has a metal $Me^2$ ion surface treatment layer, thereby adjusting electron mobility. For example, even though ZnMgO nanoparticles have the same composition, electron mobility is adjusted when metal ion surface treatment is further performed as proposed by the present disclosure. For example, when Mg ion surface treatment is further performed, electron mobility reduces.

With electron mobility adjustment, the metal oxide nanoparticle according to the present disclosure may reduce charge imbalance when applied to an electron transport layer of a quantum dot light-emitting diode. The improved injection balance of electrons and holes into a quantum dot emitting layer makes it possible to improve the performance of the quantum dot light-emitting diode, especially, luminance and efficiency.

shows luminance as a function of current density, and (c) shows current efficiency and EQE as a function of current density.

Figure 11:
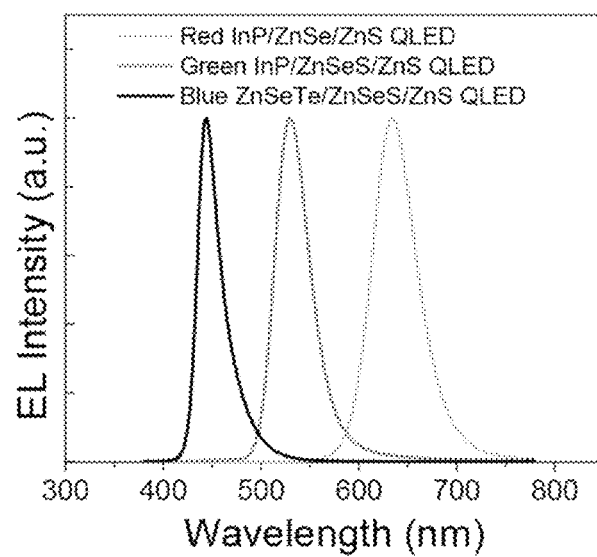

FIG. 11 is EL spectrum obtained at maximum luminance of $Zn_{0.5}Mg_{0.15}O@Mg$ nanoparticle ETL based red, green, and blue QLEDs.

DESCRIPTION OF EMBODIMENTS

Hereinafter, the preferred embodiments of the present disclosure will be described in detail with reference to the accompanying drawings. However, the present disclosure is not intended to limit the disclosed embodiments and will be embodied in a variety of different forms, and rather, the disclosed embodiments make the present disclosure complete and are provided to help those skilled in the art to fully understand the scope of the present disclosure.

Commercialization of QLED based displays may require higher luminance and efficiency of non-Cd QD QLEDs in all the red, green and blue regions. To this end, it may be necessary to improve the structure design and CTL materials for balanced charge injection into QD EML of QLED.

As mentioned above, the performance of a quantum dot light-emitting diode (QLED) is greatly affected by the efficiency of radiative recombination of exciton, and when a charge imbalance occurs in a QD emitting layer, a nonradiative process occurs, not radiative recombination of exciton. To address this issue, the inventors have made an invention to develop charge transfer layer materials to achieve the balanced injection of electron and hole into the QD emitting layer.

The present disclosure proposes a metal oxide nanoparticle for an electron transport layer of the QLED.

Figure 1:
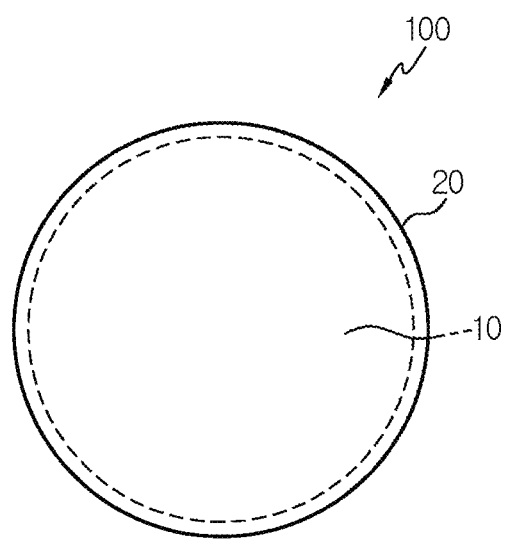
FIG. 1 is a schematic diagram of a metal oxide nanoparticle according to the present disclosure.

FIG. 1 is a schematic diagram of the metal oxide nanoparticle according to the present disclosure.

The metal oxide nanoparticle 100 includes a Zn-containing metal $Me^1$ oxide nanoparticle 10, and a metal $Me^2$ ion surface treatment layer 20 formed on the surface of the nanoparticle 10.

The composition of the Zn-containing metal $Me^1$ oxide nanoparticle 10 is $Zn_{1-x}Me^1_xO$ (0≤x≤0.5). Here, the metal $Me^1$ is any one selected from Li, Be, Na, Mg, Al, K, Ca, Ti, V, Cr, Mn, Fe, Co, Ni, Cu, Ga, Ge, Rb, Sr, Zr, Nb, Mo, Ru, Rh, Pd, Ag, In, Sn, Sb, Ba and a combination thereof. The metal $Me^2$ is any one selected from Li, Be, Na, Mg, Al, K, Ca, Ti, V, Cr, Mn, Fe, Co, Ni, Cu, Zn, Ga, Ge, Rb, Sr, Zr, Nb, Mo, Ru, Rh, Pd, Ag, In, Sn, Sb, Ba and a combination thereof.

Here, the $Me^1$ and $Me^2$ are metals that bonds with oxygen to produce metal oxide. The $Me^1$ and $Me^2$ may be selected as the same one, but may not be the same one. According to the combination of $Me^1$ and $Me^2$, the electron mobility of the final metal oxide nanoparticle 100 may be different from the electron mobility of the Zn-containing metal $Me^1$ oxide nanoparticle 10. That is to say, the electron mobility of the final metal oxide nanoparticle 100 may be greater or less than the electron mobility of the Zn-containing metal $Me^1$ oxide nanoparticle 10.

For example, when $Me^1$ and $Me^2$ are equally Mg, a Mg ion surface treatment layer is formed on the surface of $Zn_{1-x}Mg_xO$ (0≤x≤0.5) nanoparticle, and Mg is rich on the surface over the entire nanoparticle. For example, the innermost composition may be $Zn_{0.9}Mg_{0.10}$ and the outermost composition may be $Zn_{0.5}Mg_{0.5}O$. In this case, the electron mobility of the final metal oxide nanoparticle 100 is less than the electron mobility of the Zn-containing metal $Me^1$ oxide nanoparticle 10.

The material of the ion surface treatment layer 20 of metal $Me^2$ may change according to the method of forming the ion surface treatment layer 20 of metal $Me^2$, for example, the type of a precursor. For example, the metal $Me^2$ ion surface treatment layer may include $Me^2$-OH. Further, the metal $Me^2$ ion surface treatment layer may be $Me^2(OH)_2$. That is, the metal $Me^2$ ion surface treatment layer may be a layer of hydroxide of the corresponding metal $Me^2$ ion.

In the previous example, when the Mg ion surface treatment layer is formed as a layer of hydroxide of Mg such as $Mg(OH)_2$ on the surface of $Zn_{1-x}Mg_xO$ (0≤x≤0.5) nanoparticle, the electron mobility of the final metal oxide nanoparticle 100 is less than that of the Zn-containing metal $Me^1$ oxide nanoparticle 10 due to the insulator effect of the layer.

As described above, the final metal oxide nanoparticle 100 may have lower electron mobility than the Zn-containing metal $Me^1$ oxide nanoparticle 10 by the metal $Me^2$ ion surface treatment layer 20.

In another example, when $Me^1$ and $Me^2$ are different from each other, for example, when $Me^1$ is Mg and $Me^2$ is Zn, a Zn ion surface treatment layer is formed on the surface of $Zn_{1-x}Mg_xO$ (0≤x≤0.5) nanoparticle, and Zn is rich on the surface over the entire nanoparticle. For example, the innermost composition may be $Zn_{0.8}Mg_{0.2}O$, and the outermost composition may be $Zn_{0.9}Mg_{0.1}O$. In this example, the electron mobility of the final metal oxide nanoparticle 100 is greater than the electron mobility of Zn-containing metal $Me^1$ oxide nanoparticle 10.

The composition of the Zn-containing metal $Me^1$ oxide nanoparticle 10 is usually determined by an amount of precursor used to fabricate the Zn-containing metal $Me^1$ oxide nanoparticle 10, but the composition of the metal $Me^2$ ion surface treatment layer 20 changes depending on the surface treatment reaction time. As the time is longer, the metal $Me^2$ content used in the surface treatment tends to increase.

The metal oxide nanoparticle 100 according to the present disclosure is fabricated by forming the Zn-containing metal $Me^1$ oxide nanoparticle 10 of $Zn_{1-x}Me^1_xO$ (0≤x≤0.5) composition, and then treating the Zn-containing metal $Me^1$ oxide nanoparticle 10 with metal $Me^2$ ions on the surface to form the metal $Me^2$ ion surface treatment layer 20.

The step of forming the metal $Me^2$ ion surface treatment layer 20 may be performed by forming the Zn-containing metal $Me^1$ oxide nanoparticle 10 in a solution, and injecting a precursor of the metal $Me^2$ into the solution to cause reaction.

The precursor of the metal $Me^2$ may be a metal salt material including the metal $Me^2$. Examples of the metal salt material may include metal oxide, metal fluoride, metal chloride, metal bromide, metal iodide, metal acetylacetonate, metal nitrate, metal acetate or a metal carboxylate salt. Additionally, a metal alkoxide material may be used. Its example may be metal isopropoxide, metal ethoxide or metal tert-butoxide.

In a specific example, the metal oxide nanoparticle is fabricated by adding a transparent solution including tetramethylammoniumhydroxide (TMAH) and ethanol to a solution of cations in dimethyl sulfoxide (DMSO) including Zn acetate dehydrate and Mg acetate tetrahydrate to cause reaction, and additionally injecting a Mg acetate tetrahydrate into the solution to cause reaction to form a Mg ion surface treatment layer on Zn-containing Mg oxide nanoparticle of $Zn_{1-x}Mg_xO$ (0≤x≤0.5) composition. As described above, formation of the Zn-containing Mg oxide nanoparticle and the Mg ion surface treatment layer are performed through a continuous process, and precipitation follows the formation of the Mg ion surface treatment layer to obtain a nanoparticle.

The metal oxide nanoparticle fabricated by this method has the Mg ion surface treatment layer formed on the surface of $Zn_{1-x}Mg_xO$ (0≤x≤0.5) nanoparticle when $Me^1$ and $Me^2$ are equally Mg, and Mg is rich on the surface. The Mg-rich layer may be present in the form of $Mg(OH)_2$. For example, when Mg acetate tetrahydrate is used as the precursor of Mg, the Mg ion surface treatment layer may be obtained in the form of $Mg(OH)_2$.

Here, the temperature condition is not very important in the metal $Me^2$ ion surface treatment, and the reaction time condition affects the metal $Me^2$ ion content on the surface of the nanoparticle, and thus it may be necessary to manage the reaction time condition. To increase the reaction time, aging may be performed.

Figure 2:
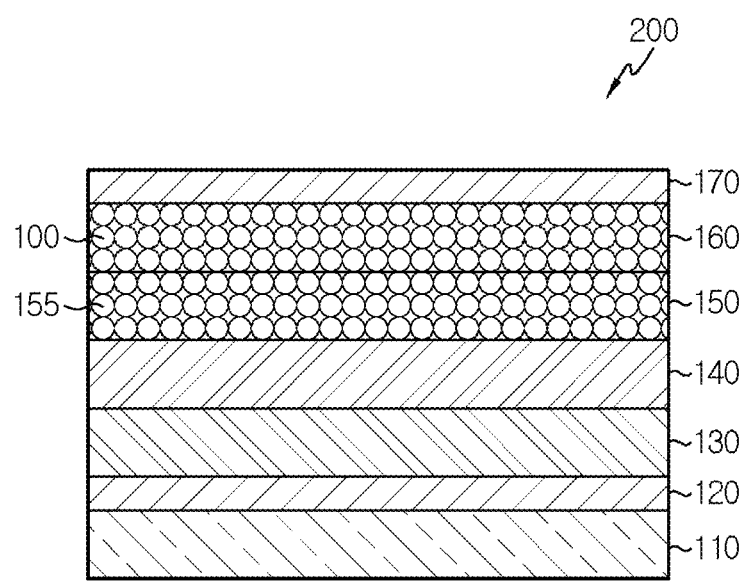
FIG. 2 is a schematic cross-sectional view of an organic light-emitting diode (QLED) according to the present disclosure.

FIG. 2 is a schematic cross-sectional view of the QLED according to the present disclosure.

As shown in FIG. 2, the QLED 200 of the present disclosure includes a hole transport layer (HTL) 140, a QD emitting layer (EML) 150 and an electron transport layer (ETL) 160. The QD EML 150 is a layer in which light is emitted by a recombination of holes and electrons from each of the HTL 140 and the ETL 160. This multilayer structure may be formed on a substrate 110 serving as mechanical support, and the QLED 200 may further include an anode 120 for hole injection, a cathode 170 for electron injection, and a hole injection layer (HIL) 130 between the anode 120 and the HTL 140.

The substrate 110 may be a glass substrate or a transparent plastic substrate that is transparent and has flat surfaces. The substrate 110 may be subjected to ultrasonic cleaning with a solvent, for example, isopropylalcohol (IPA), acetone or methanol, and UV ozone treatment to remove contaminants.

The anode 120 and the cathode 170 include a metal, and are made of inorganics of metal oxide or other non-oxide suitable for each transparent/opaque condition. For bottom emission, the anode 120 may be made of a transparent conductive metal such as transparent ITO, IZO, ITZO and AZO, and the cathode 170 may be made of a metal of low work function, for example, I, Ca, Ba, Ca/Al, LiF/Ca, LiF/Al, $BaF_2$/Al, $BaF_2$/Ca/Al, Al, Mg, Ag:Mg alloy to facilitate the electron injection.

The HIL 130 and the HTL 140 serve to facilitate the hole injection from the anode 120, and transport holes to the QD EML 150. To form the HIL 130 and the HTL 140, organics or inorganics may be used, for example, any one selected from poly(ethylenedioxythiophene):polystyrene sulphonate (PEDOT:PSS), poly[(9,9-dioctyl-fluorenyl-2,7-diyl)-co-(4, 4'-(N-(p-butylphenyl))diphenylamine)](TFB), poly(9-vinyl-carbazole)(PVK), N,N,N,N',N'-tetrakis(4-methoxyphenyl)-benzidine (TPD), poly-TPD, 4,4',4''-tris(N-carbazolyl)-triphenylamine (TCTA), N,N'-bis(naphthalen-1-yl)-N, N'bis(phenyl)-9,9-spiro-bifluorene (spiro-NPB), dipyrazino[2,3-f:2',3'-h]quinoxaline-2,3,6,7,10,11-hexacarbonitrile (HATCN), 1,1-bis[(di-4-tolylamino)phenylcyclohexane (TAPC), p-type metal oxide and a combination thereof. The p-type metal oxide may be, for example, NiO, $MoO_3$, $WO_3$. According to a preferred embodiment, the HTL 140 is an organic material. In a specific example, the HIL 130 is PEDOT:PSS, and the HTL 140 is PVK or TFB.

The QD EML 150 is a layer filled with nm sized QDs 155 having the diameter of 1 nm~100 nm, and here, the QD EML 150 may be formed by, for example, coating a dispersion containing the QDs 155 in a solvent on the HTL 140 by a solution process, followed by volatilization of the solvent. The coating method may include, for example, drop casting, spin coating, dip coating, spray coating, flow coating, screen printing and inkjet printing, alone or in combination.

The QD 155 refers to a semiconductor nanocrystal having the quantum confinement effect, and may include Group II-VI, I-III-VI or III-V nano semiconductor compound, preferably non-Cd based Group I-II-VI or III-V. The QD 155 may have a single structure or a core/shell structure. Preferably, the QD 155 has a core/shell structure in which a core is at the center and emits light, a shell surrounds the core on the surface to protect the core, and a ligand surrounds the shell on the surface for dispersion in a solvent. In some cases, the ligand may be removed when forming the QD EML 150. For example, in the QD 155, the composition of the core may include, but is not limited to, Group II-VI (e.g., CdS, CdSe, CdTe, ZnS, ZnSe, ZnTe, HgS, HgSe, HgTe, MgSe, MgS, MgTe binary compositions or their ternary and quaternary compositions), Group III-V (e.g., AlP, AlAs, AlSb, GaP, GaAs, GaSb, InP, InAs, InSb binary compositions or their ternary and quaternary compositions), Group III-V (e.g., InZnP) or I-III-VI ($CuAlS_2$, $CuAlSe_2$, $CuAlTe_2$, $CuGaS_2$, $CuGaSe_2$, $CuGaTe_2$, $CuInS_2$, $CuInSe_2$, $CuInTe_2$, $AgAS_2$, $AgGaS_2$, $AgInS_2$ ternary compositions or their quaternary compositions) including Group II elements. Likewise, the composition of the shell may include the semiconductor compositions mentioned previously. There may be a single shell or multiple shells of different compositions in the core-shell structure.

The QD 155 may be chiefly synthesized by a wet process that grows particles with an addition of a precursor material to an organic solvent. Light of various wavelengths may be obtained by adjusting the energy bandgap according to the extent of particle growth.

The ETL 160 serves to facilitate the electron injection from the cathode 170, and transport electrons to the QD EML 150. The ETL 160 includes the metal oxide nanoparticle 100 according to the present disclosure. For example, the ETL 160 may be formed by coating a dispersion containing the metal oxide nanoparticle 100 in a solvent on the QD EML 150 by a solution process, followed by volatilization of the solvent.

Hereinafter, the present disclosure will be described in more detail by describing the experimental examples of the present disclosure in detail.

Comparative Example $Zn_{1-x}Mg_xO$(x=0.15) nanoparticles are synthesized through a solution-precipitation chemical method.

To fabricate $Zn_{0.85}Mg_{0.15}O$ nanoparticles, 8.5 mmol of Zn acetate dehydrate, 1.5 mmol of Mg acetate tetrahydrate and 40 mL of DMSO are put into a reactor and dissolved. 10 mL of a solution containing 10 mmol of TMAH dissolved in ethanol is slowly injected into the reactor, to cause reaction at 4° C. for 1 hour. After the reaction, the precipitated $Zn_{0.85}Mg_{0.15}O$ nanoparticles obtained by adding the solution to acetone and performing centrifugal separation are dispersed in 5 mL of ethanol and used for analysis and device fabrication.

Experimental Example

To fabricate $Zn_{0.85}Mg_{0.15}O$ nanoparticles, the same method as described in the above comparative example is used, and 8.5 mmol of Zn acetate dihydrate, 1.5 mmol of Mg acetate tetrahydrate and 40 mL of DMSO are put into a reactor and dissolved. 10 mL of a solution containing 10 mmol of TMAH dissolved in ethanol is slowly injected into the reactor, to cause reaction at 4° C. for 1 hour. Another 5 mmol of Mg acetate tetrahydrate is put into the reaction solution, and surface treatment is performed at 4° C. for 1 hour. After the reaction, the solution is placed in an oven at 30° C. atmosphere and subjected to aging for 24 hours. After the aging, acetone is added to the solution and centrifugal separation is performed to obtain precipitated nanoparticles including $Zn_{0.85}Mg_{0.15}O+Mg$ ion surface treatment layer (designated as $Zn_{0.85}Mg_{0.15}O@Mg$), and the precipitated nanoparticles are dispersed in 5 mL of ethanol and used for analysis and device fabrication.

Fabrication of Red, Green, and Blue Emitting QLEDs

Six QLEDs are fabricated by the same method using a combination of three types of QD EMLs of red emitting InP/ZnSe/ZnS, green emitting InP/ZnSeS/ZnS and blue emitting ZnSeTe/ZnSeS/ZnS, and two types of ETLs of $Zn_{0.85}Mg_{0.15}O$ and $Zn_{0.85}Mg_{0.15}O@Mg$ nanoparticles. An ITO anode, a PEDOT:PSS HIL, a PVK or TFB HTL, a QD EML, a nanoparticle ETL and an Al cathode are stacked in that order.

A glass substrate having the patterned ITO anode deposited thereon is washed with each of acetone and methanol for 15 minutes, and treated with UV-ozone for 20 minutes. PEDOT:PSS (AI 4083) is spin-coated within a glove box at 3000 rpm for 60 seconds and baked at 150° C. for 30 minutes to form a HIL. In the case of the red and green QLEDs, TFB at the concentration of 8 mg/mL is spin-coated thereon at 4000 rpm for 30 seconds, or in the case of the blue QLEDs, PVK at the concentration of 10 mg/mL is spin-coated at 3000 rpm for 30 seconds and baked in the same condition as the HIL to form a HTL. Prior to forming a QD EML, the optical density (OD, an absorbance value at $1^{st}$ excitonic absorption peak) of a solution containing QDs dispersed in hexane is adjusted to 0.9 for red InP/ZnSe/ZnS, 0.8 for green InP/ZnSeS/ZnS and 2.7 for blue ZnSeTe/ZnSeS/ZnS. The QD dispersion is spin-coated on the HTL at 3000 rpm for 20 seconds and dried at 70° C. for 10 minutes. Subsequently, ethanol is additionally put into a solution containing $Zn_{0.85}Mg_{0.15}O$ or $Zn_{0.85}Mg_{0.15}O@Mg$ nanoparticles dispersed in ethanol to adjust the concentration such that a volume ratio of the solution and the added ethanol is 1:1 (red QLED), 1:1.5 (green QLED), 1:2 (blue QLED). The nanoparticle solution of the adjusted concentration is spin-coated on the QD EML at 3000 rpm for 60 seconds and naturally dried to form an ETL. Finally, a 100 nm thick Al cathode is formed through a linear metal mask and a thermal evaporator, and fabrication of QLED having four square emission spots having the area of 9 mm$^2$ is completed.

Fabrication of Electron-Only-Device (EOD)

To compare the electron mobility of $Zn_{0.85}Mg_{0.15}O$ and $Zn_{0.85}Mg_{0.15}O@Mg$ nanoparticles, a blue emitting ZnSeTe/ZnSeS/ZnS QD based EOD is fabricated. The structure of the EOD includes ITO/$Zn_{0.85}Mg_{0.15}O$ or $Zn_{0.85}Mg_{0.15}O@Mg$ nanoparticles/QDs/$Zn_{0.85}Mg_{0.15}O$ or $Zn_{0.85}Mg_{0.15}O@Mg$ nanoparticles/Al in that order. The concentration of the solution used and the condition for forming a film are the same as those of the QLED.

Evaluation:

For surface composition analysis of $Zn_{0.85}Mg_{0.15}O$ and $Zn_{0.85}Mg_{0.15}O@Mg$ nanoparticles, XPS (Thermo Scientific Inc.) with Al $K_\alpha$ X-ray (E=1486.6 eV) source is used. $Zn_{0.85}Mg_{0.15}O$ and $Zn_{0.85}Mg_{0.15}@Mg$ nanoparticles are imaged by TEM using JEOL JEM-F200 that operates at 200 kV. UV-vis spectrophotometer (Shimadzu, UV-2450) is used to record the absorption spectrum of red, green, and blue QDs and $Zn_{0.85}Mg_{0.15}O$ and $Zn_{0.85}Mg_{0.15}O@Mg$ nanoparticles. The EL spectrum and luminance-current density-voltage characteristics of QLED are measured using Konica-Minolta CS-2000 spectroradiometer with Keithley 2400 voltage and current source.

Result:

Analysis is conducted to investigate the effect of Mg acetate tetrahydrate additionally injected in the $Zn_{0.85}Mg_{0.15}O$ nanoparticle synthesis. As a result of analyzing a change in the components of $Zn_{0.85}Mg_{0.15}O$ and $Zn_{0.85}Mg_{0.15}O@Mg$ nanoparticles through inductively coupled plasma optical emission spectrometer (ICP-OES) measurements, after Mg ion surface treatment is performed, the Zn content reduces from 90.78% to 79.99% and the Mg content increases from 9.21% to 20.01%.

TABLE 1

| Sample | Zn content | Mg content |
| --- | --- | --- |
| $Zn_{0.85}Mg_{0.15}O$ | 90.78% | 9.21% |
| $Zn_{0.85}Mg_{0.15}O@Mg$ | 79.99% | 20.01% |

Surface analysis of two types of synthesized nanoparticles, $Zn_{0.85}Mg_{0.15}O$ and $Zn_{0.85}Mg_{0.15}O@Mg$, is conducted through X-ray photoelectron spectroscopy (XPS) measurements.

Figure 3:
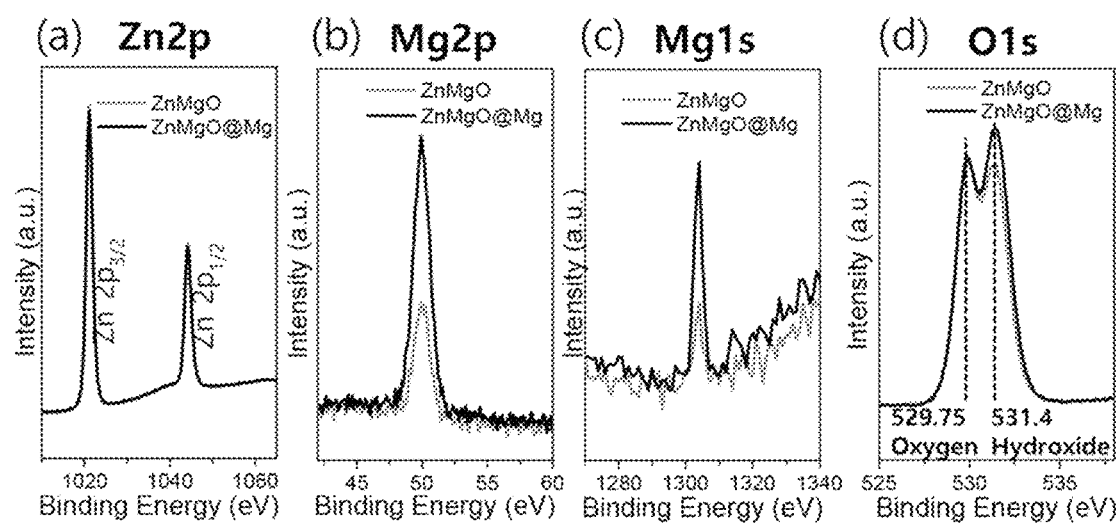
FIG. 3 is an X-ray photoelectron spectroscopy (XPS) spectrum of $Zn_{0.85}Mg_{0.15}O$ and $Zn_{0.85}Mg_{0.15}O@Mg$ nanoparticles.

FIG. 3 shows XPS spectrum of $Zn_{0.85}Mg_{0.15}O$ and $Zn_{0.85}Mg_{0.15}O@Mg$ nanoparticles. First, referring to the Zn 2p spectrum of FIG. 3(a), there is no observed change in the position and intensity of peak occurring from Zn $2p_{3/2}$ and Zn $2p_{1/2}$ bond on the surface of the two types of nanoparticles. In the Mg 2p spectrum of FIG. 3(b) and the Mg 1s spectrum of FIG. 3(c), it is observed that there is an increase in the intensity of peak occurring on the surface of $Zn_{0.85}Mg_{0.15}O@Mg$ nanoparticle after Mg ion surface treatment is performed. Additionally, of two peaks in the O is spectrum of FIG. 3(d), there is no observed change in the intensity of peak occurring from oxygen present in the lattice positioned at 529.75 eV, while there is an increase in the intensity of peak occurring from oxygen present in hydroxide bond at 531.4 eV on the surface of $Zn_{0.85}Mg_{0.15}O@Mg$ nanoparticles after the Mg ion surface treatment is performed. The ICP and XPS analysis reveals that the Mg content on the surface of $Zn_{0.85}Mg_{0.15}O$ nanoparticles increases due to the reaction with Mg$^{2+}$ ions on the surface. Additionally, it is found that hydroxide bonding increases, and a Mg(OH)$_2$ layer is formed on the surface of $Zn_{0.85}Mg_{0.15}O@Mg$ nanoparticles. Both Zn and Mg exist in the nanoparticles, and there is a larger amount of Mg inside than the surface.

Figure 4:
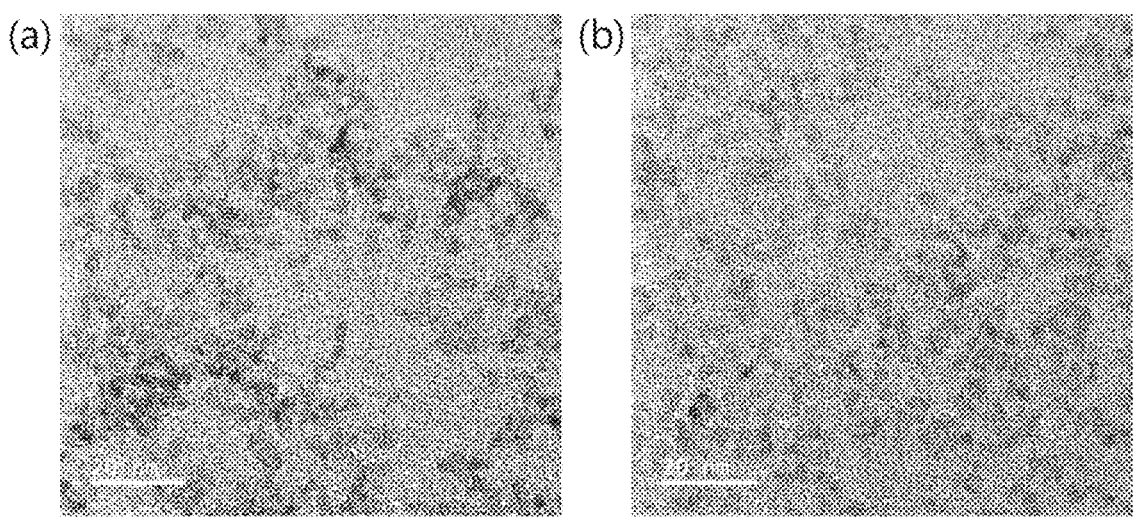
FIG. 4 is a transmission electron microscope (TEM) image of $Zn_{0.85}Mg_{0.15}O$ and $Zn_{0.85}Mg_{0.15}O@Mg$ nanoparticles (scale bar: 20 nm).

FIG. 4 is a TEM image of $Zn_{0.85}Mg_{0.15}O$ and $Zn_{0.85}Mg_{0.15}O@Mg$ nanoparticles (scale bar: 20 nm). Through the TEM image, a small difference of 3~4 nm in measured sizes between the two types of nanoparticles is observed.

Figure 5:
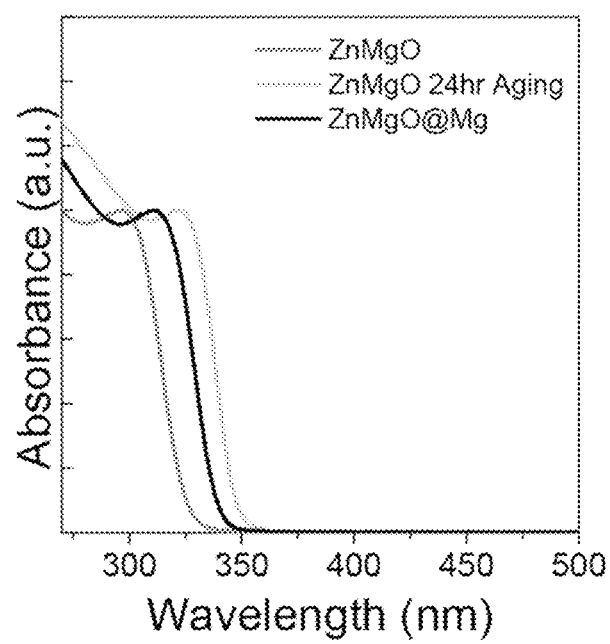
FIG. 5 is an absorption spectrum of $Zn_{0.85}Mg_{0.15}O$ and $Zn_{0.85}Mg_{0.15}O@Mg$ nanoparticles.

FIG. 5 is an absorption spectrum of $Zn_{0.85}Mg_{0.15}O$ and $Zn_{0.85}Mg_{0.15}O@Mg$ nanoparticles.

Referring to FIG. 5, as the peak position of $Zn_{0.85}Mg_{0.15}O$ nanoparticles in the absorption spectrum is 297 nm and the peak position of $Zn_{0.85}Mg_{0.15}O@Mg$ nanoparticles surface-treated with Mg$^{2+}$ ion is 312 nm. To investigate a factor that changes the peak, aging is performed alone without additional injection of Mg acetate tetrahydrate into $Zn_{0.85}Mg_{0.15}O$. It is found that the peak position of $Zn_{0.85}Mg_{0.15}O$ nanoparticles subjected to aging alone is 323 nm. Through this, it can be seen that a change in absorption peak is a result of aging, but a reduction in change is caused by the Mg ion surface treatment.

Figure 6:
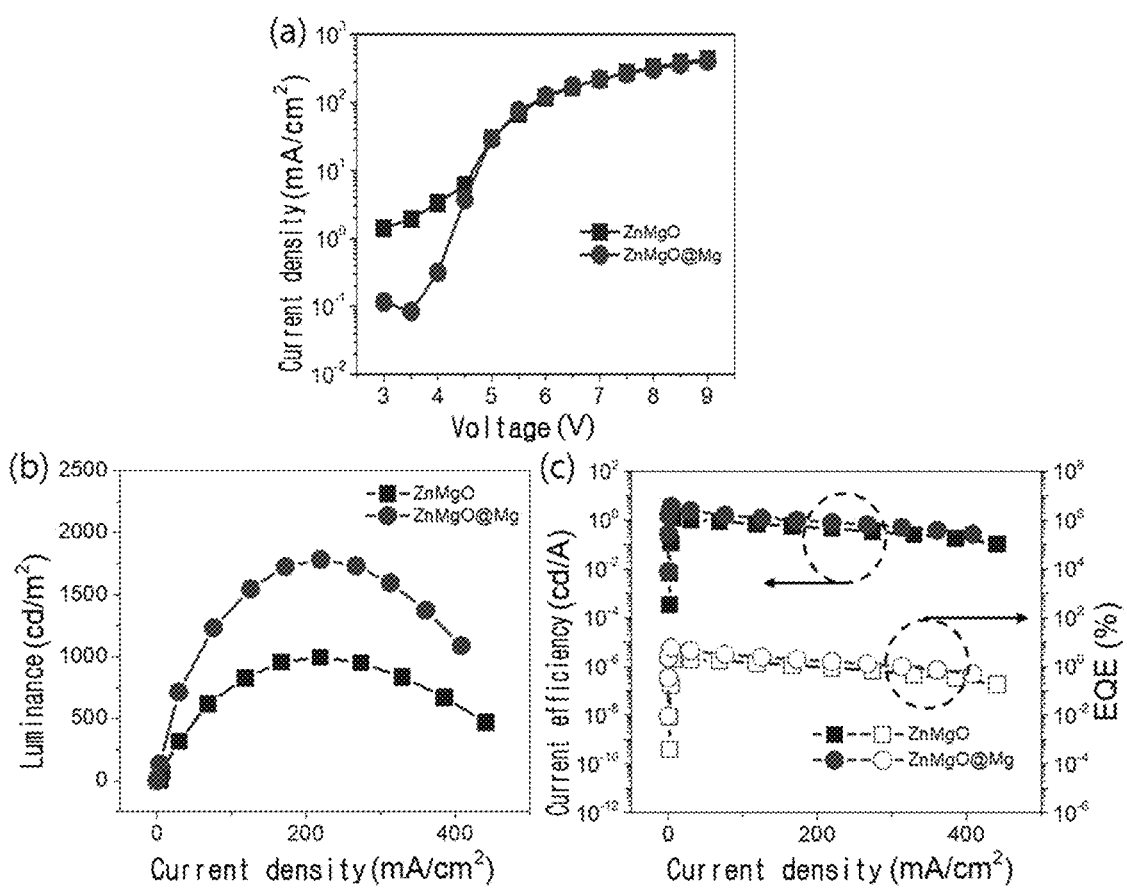
FIG. 6 shows the performance of blue emitting ZnSeTe/ZnSeS/ZnS QD EML and $Zn_{0.85}Mg_{0.15}O$ or $Zn_{0.85}Mg_{0.15}@Mg$ nanoparticle electron transport layer (ETL) based QLED, (a) shows current density as a function of driving voltage, (b) shows luminance as a function of current density, and (c) shows current efficiency and EQE as a function of current density.

FIG. 6 shows the performance of blue emitting ZnSeTe/ZnSeS/ZnS QD EML and $Zn_{0.85}Mg_{0.15}O$ or $Zn_{0.85}Mg_{0.15}O@Mg$ nanoparticle ETL based QLED. (a) shows the current density as a function of driving voltage, (b) shows the luminance as a function of current density, and (c) shows the current efficiency and EQE as a function of current density.

When comparing the current density changes with voltage changes, the current density of QLED using $Zn_{0.85}Mg_{0.15}O@Mg$ nanoparticle ETL is lower than $Zn_{0.85}Mg_{0.15}O$ nanoparticle based device, and the leakage current also reduces (FIG. 6(a)). When comparing luminance and device efficiency changes as a function of current density, the performance of $Zn_{0.85}Mg_{0.15}O@Mg$ nanoparticle based QLED is higher than that of $Zn_{0.85}Mg_{0.15}O$ nanoparticle based QLED (FIG. 6(b), (c)). Compared to $Zn_{0.85}Mg_{0.15}O$ nanoparticle based QLED, the luminance of QLED using $Zn_{0.85}Mg_{0.15}O@Mg$ nanoparticle ETL increases from 995 cd/m$^2$ to 1781 cd/m$^2$ and the current efficiency and external quantum efficiency increase from 1.2 cd/A to 3.6 cd/A and from 2% to 6%, respectively. As a result, using the $Zn_{0.85}Mg_{0.15}O@Mg$ nanoparticle ETL, the performance of blue emitting ZnSeTe/ZnSeS/ZnS QLED is improved.

TABLE 2

Blue QLED

| ETL | Maximum luminance (cd/m2) | Maximum current efficiency (cd/A) | Maximum external quantum efficiency (A) |
|---|---|---|---|
| $Zn_{0.85}Mg_{0.15}O$ | 995 | 1.2 | 2 |
| $Zn_{0.85}Mg_{0.15}O@Mg$ | 1781 | 3.6 | 6 |

A difference in current density between two types of EODs, for example, two types of nanoparticle ETL based QLEDs is analyzed. The structure of the EOD is ITO/$Zn_{0.85}Mg_{0.15}O$ or $Zn_{0.85}Mg_{0.15}O@Mg$/ZnSeTe/ZnSeS/ZnS QDs/$Zn_{0.85}Mg_{0.15}O$ or $Zn_{0.85}Mg_{0.15}O@Mg$/Al.

Figure 7:
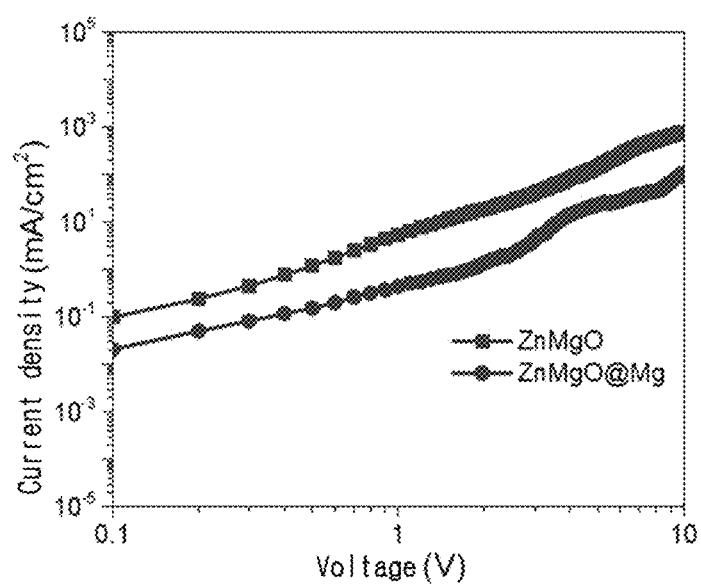
FIG. 7 shows a result of measuring the current density of $Zn_{0.85}Mg_{0.15}O@Mg$ based electron-only-device (EOD) and the current density of $Zn_{0.85}Mg_{0.15}O$ based EOD.

FIG. 7 shows the measurement results of current density of $Zn_{0.85}Mg_{0.15}O@Mg$ based EOD and $Zn_{0.85}Mg_{0.15}O$ based EOD. As a result of analyzing the current density as a function of voltage of the fabricated EODs, as shown in FIG. 7, the current density of $Zn_{0.85}Mg_{0.15}O@Mg$ based EOD is lower than the current density of $Zn_{0.85}Mg_{0.15}O$ based EOD. That is, it can be seen that the electron mobility of $Zn_{0.85}Mg_{0.15}O@Mg$ nanoparticles is slower than the electron mobility of $Zn_{0.85}Mg_{0.15}O$ nanoparticles.

The electron mobility of ZnO is caused by oxygen vacancy. As the binding energy (393.7 kJ/mol) of Mg—O bond is stronger than the binding energy (284.1 kJ/mol) of Zn—O bond, the presence of Mg makes it more difficult to generate oxygen vacancy, and alloying with Mg or surface treatment with Mg reduces the oxygen vacancy concentration. As the oxygen vacancy concentration is reduced by the Mg surface treatment, the electron mobility of $Zn_{0.85}Mg_{0.15}O@Mg$ nanoparticles is less than the electron mobility of $Zn_{0.85}Mg_{0.15}O$ nanoparticles. Additionally, the presence of insulator $Mg(OH)_2$ prohibits the movement of electrons, resulting in reduced electron mobility.

Meanwhile, the intragap state within the bandgap of $Zn_{0.85}Mg_{0.15}O$ nanoparticles traps holes of adjacent QDs, inducing exciton quenching. This is one of factors that reduce the efficiency of QLED.

Figure 8:
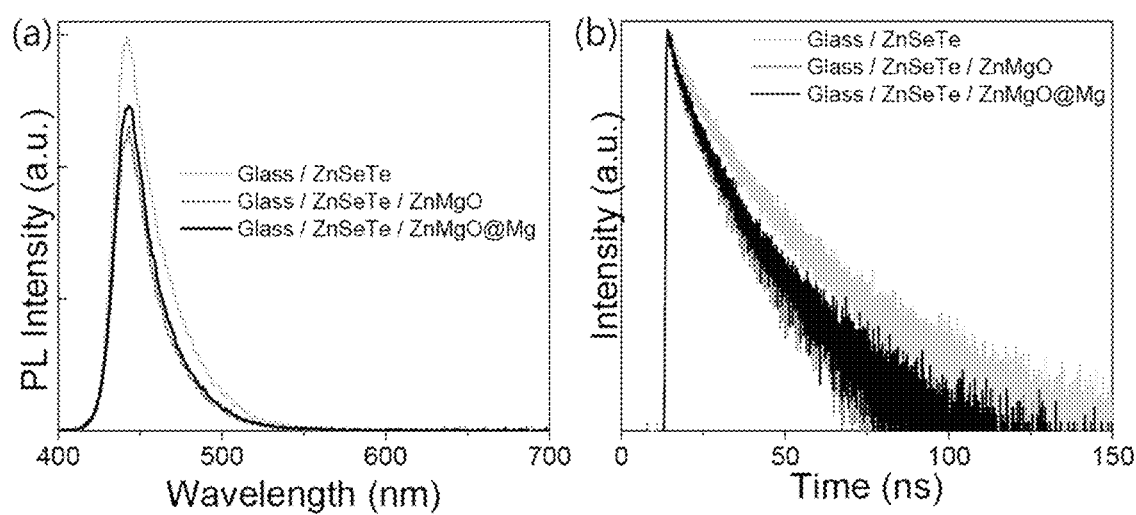
FIG. 8 shows (a) PL spectrum, and (b) time-resolved PL spectrum of three samples (glass substrate/quantum dot (QD), glass substrate/QD/$Zn_{0.85}Mg_{0.15}O$, and glass substrate/QD/$Zn_{0.85}Mg_{0.15}O(@Mg)$).

FIG. 8 shows (a) PL spectrum, and (b) time-resolved PL spectrum of three samples (glass substrate/QDs, glass substrate/QDs/$Zn_{0.85}Mg_{0.15}O$, and glass substrate/QDs/$Zn_{0.85}Mg_{0.15}O@Mg$).

As shown in FIG. 8(a), it can be seen that the PL intensity of the sample having the $Zn_{0.85}Mg_{0.15}O$ nanoparticle layer formed on the ZnSeTe/ZnSeS/ZnS QD layer is lower than PL intensity of the sample having the ZnSeTe/ZnSeS/ZnS QD layer alone. When the $Zn_{0.85}Mg_{0.15}O@Mg$ nanoparticle layer, not $Zn_{0.85}Mg_{0.15}O$ nanoparticle, is formed on the ZnSeTe/ZnSeS/ZnS QD layer, an increase in PL intensity is observed. Additionally, as the exciton lifetime is 15.33 ns in the sample having the $Zn_{0.85}Mg_{0.15}O$ nanoparticle layer formed on the ZnSeTe/ZnSeS/ZnS QD layer and 16.6 ns in the sample having the $Zn_{0.85}Mg_{0.15}O@Mg$ nanoparticle layer (FIG. 8(b)). It is thought that this result from a reduction in surface defects caused by dangling bonds positioned on the surface of $Zn_{0.85}Mg_{0.15}@Mg$ nanoparticles surface-treated with Mg ions, and a consequential decrease of the intragap state within the bandgap. The low electron mobility of $Zn_{0.85}Mg_{0.15}O@Mg$ nanoparticles improves the charge balance in the QD EML and lower surface defects than $Zn_{0.85}Mg_{0.15}O$ nanoparticles reduce exciton quenching, thereby improving the performance of blue ZnSeTe/ZnSeS/ZnS QLED.

A reduction in surface defects induced by the dangling bond present on the surface $Zn_{0.85}Mg_{0.15}@Mg$ may be understood by referring to XPS data shown in FIG. 3. As shown in FIG. 3, it is observed that as the surface treatment with Mg ions is performed, Mg signals from the surface of $Zn_{0.85}Mg_{0.15}O$ nanoparticles are stronger. There are dangling bonds on the surface of $Zn_{0.85}Mg_{0.15}O$ nanoparticles, and when reacted with the Mg ions, the dangling bonds reduce.

Figure 9:
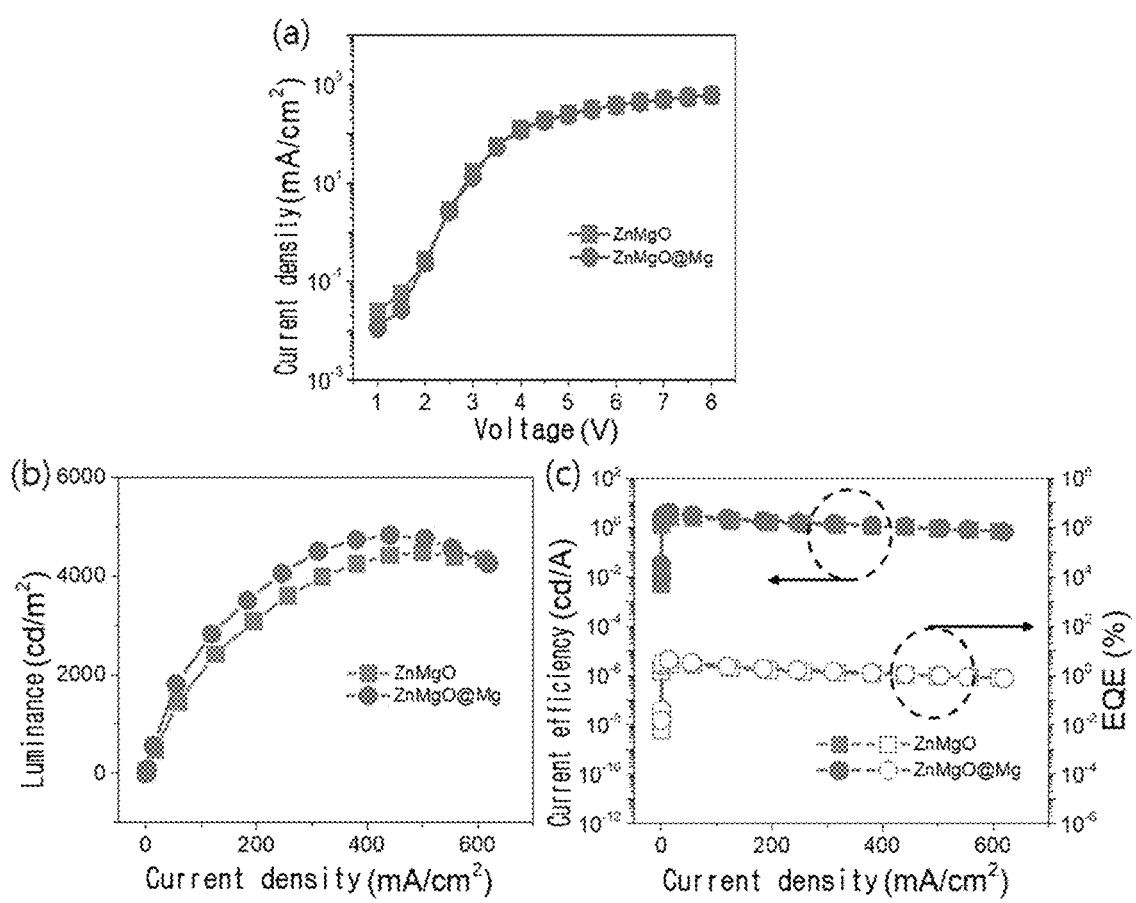
FIG. 9 shows the performance of red emitting InP/ZnSe/ZnS QD EML and $Zn_{0.85}Mg_{0.15}O$ or $Zn_{0.85}Mg_{0.15}@Mg$ nanoparticle ETL based QLED, (a) shows current density as a function of driving voltage, (b) shows luminance as a function of current density, and (c) shows current efficiency and EQE as a function of current density.

To investigate the effect of $Zn_{0.85}Mg_{0.15}O@Mg$ nanoparticle ETL, red and green QLEDs with $Zn_{0.85}Mg_{0.15}O$ or $Zn_{0.85}Mg_{0.15}O@Mg$ nanoparticle ETL are fabricated. FIG. 9 shows the performance of red InP/ZnSe/ZnS QD EML and $Zn_{0.85}Mg_{0.15}O$ or $Zn_{0.85}Mg_{0.15}O@Mg$ nanoparticle ETL based QLED. (a) shows the current density as a function of driving voltage, (b) shows the luminance as a function of current density, and (c) shows the current efficiency and EQE as a function of current density.

Seeing FIG. 9(a), it can be seen that the current density of $Zn_{0.85}Mg_{0.15}O$ nanoparticle ETL and the current density of $Zn_{0.85}Mg_{0.15}O@Mg$ nanoparticle ETL seem nearly similar to each other, but the current density of $Zn_{0.85}Mg_{0.5}O@Mg$ nanoparticle ETL is lower than that of $Zn_{0.85}Mg_{0.15}O$ nanoparticle ETL at or around low voltage. When comparing luminance, current efficiency, and external quantum efficiency as a function of current density, the performance of $Zn_{0.85}Mg_{0.15}O@Mg$ nanoparticle ETL based QLED is better than that of $Zn_{0.85}Mg_{0.15}O$ nanoparticle ETL based QLED (see FIGS. 9(b) and (c)). The $Zn_{0.85}Mg_{0.15}O$ nanoparticle based device has luminance, current efficiency, and external quantum efficiency of 4482 cd/m$^2$, 2.8 cd/A and 2.9% respectively, and the $Zn_{0.85}Mg_{0.15}O@Mg$ nanoparticle based device has improved luminance, current efficiency, and external quantum efficiency of 4827 cd/m$^2$, 4.2 cd/A and 4.3% respectively.

TABLE 3

Red QLED

| ETL | Maximum luminance (cd/m2) | Maximum current efficiency (cd/A) | Maximum external quantum efficiency (A) |
|---|---|---|---|
| $Zn_{0.85}Mg_{0.15}O$ | 4482 | 2.8 | 2.9 |
| $Zn_{0.85}Mg_{0.15}O@Mg$ | 4827 | 4.2 | 4.3 |

Figure 10:
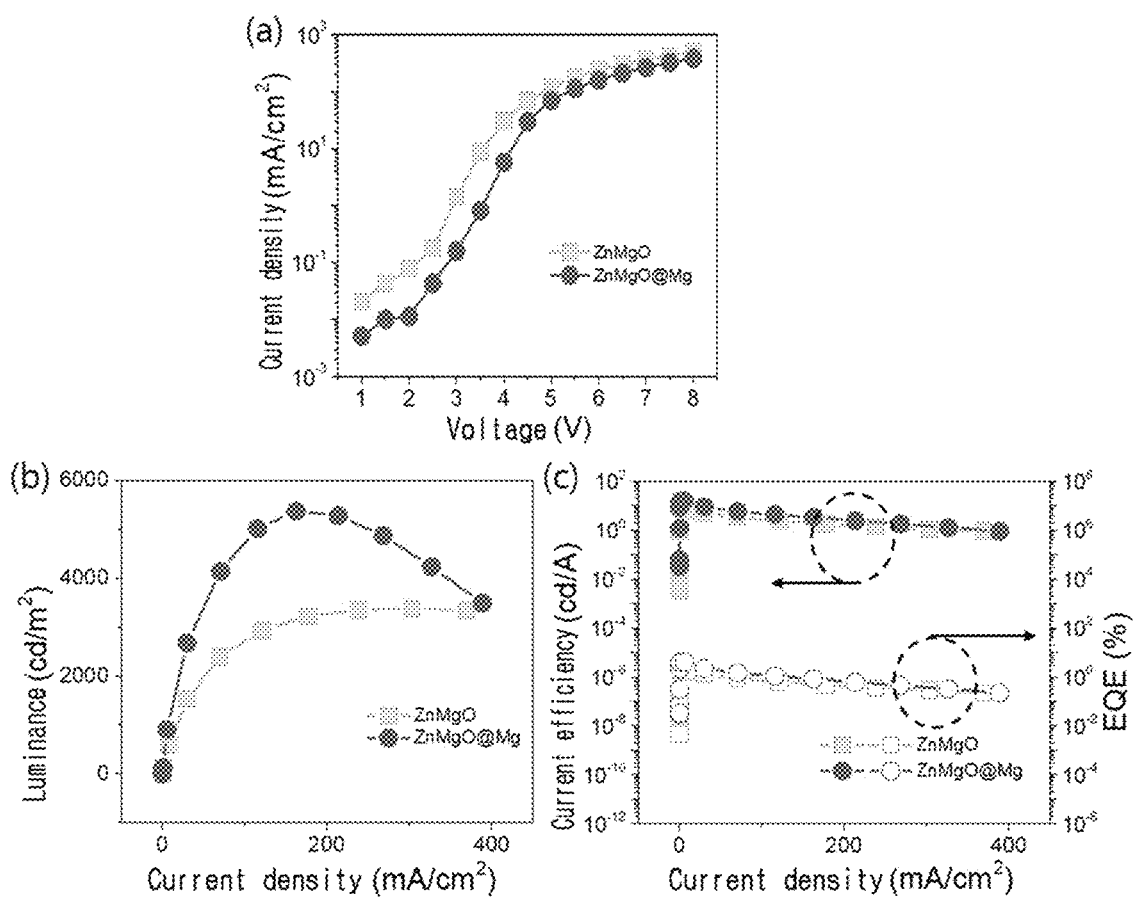
FIG. 10 shows the performance of green emitting InP/ZnSeS/ZnS QD EML and $Zn_{0.85}Mg_{0.15}O$ or $Zn_{0.85}Mg_{0.15}@Mg$ nanoparticle ETL based QLED, (a) shows current density as a function of driving voltage, (b)

FIG. 10 shows the performance of QLED with green InP/ZnSeS/ZnS QDs and $Zn_{0.85}Mg_{0.15}O$ or $Zn_{0.85}Mg_{0.15}O@Mg$ nanoparticle ETL. (a) shows the current density as a function of driving voltage, (b) shows the luminance as a function of current density, and (c) shows the current efficiency and EQE as a function of current density. As shown in FIG. 10(a), the current density of the $Zn_{0.85}Mg_{0.15}O@Mg$ nanoparticle ETL based device is much lower than the current density of the $Zn_{0.85}Mg_{0.15}O$ nanoparticle ETL based device. In the same way as the blue and red QLEDs, when comparing luminance and device efficiency as a function of current density, $Zn_{0.85}Mg_{0.15}O@Mg$ nanoparticle based device having better performance than $Zn_{0.85}Mg_{0.15}O$ nanoparticle based device can be also seen in the green QLED (see FIGS. 10(b) and (c)). The $Zn_{0.85}Mg_{0.15}O$ nanoparticle ETL based green QLED has the maximum luminance, the maximum current efficiency and the maximum external quantum efficiency of 3377 cd/m$^2$, 7 cd/A and 1.8% respectively, and the $Zn_{0.85}Mg_{0.15}O@Mg$ nanoparticle ETL based green QLED has the maximum luminance, the maximum current efficiency and the maximum external quantum efficiency of 5278 cd/m$^2$, 15.8 cd/A and 4% respectively.

TABLE 4

Green QLED

| ETL | Maximum luminance (cd/m2) | Maximum current efficiency (cd/A) | Maximum external quantum efficiency (A) |
|---|---|---|---|
| $Zn_{0.85}Mg_{0.15}O$ | 3377 | 7 | 1.8 |
| $Zn_{0.85}Mg_{0.15}O@Mg$ | 5278 | 15.8 | 4 |

FIG. 11 shows the EL spectrum obtained from the maximum luminance of $Zn_{0.85}Mg_{0.15}O@Mg$ nanoparticle ETL based red, green, and blue QLEDs. In conclusion, the blue ZnSeTe/ZnSeS/ZnS QD based samples show lower electron mobility and reduced exciton quenching of $Zn_{0.85}Mg_{0.15}O@Mg$ nanoparticles than $Zn_{0.85}Mg_{0.15}O$ nanoparticles, and these effects are equally applied to red and green QLEDs, resulting in improved device performance.

This work was supported by the National Research Foundation of Korea (NRF) grant funded by Ministry of Science, ICT & Future Planning (MSIP) (No. 2017R1A2B3008628, No. 2018M3D1A1058536) and Basic Science Research Program through the NRF funded by Ministry of Education (No. 2015R1A6A1A03031833).

While the preferred embodiments of the present disclosure have been hereinabove shown and described, the present disclosure is not limited to a particular preferred embodiment, and it is obvious to those skilled in the art that many modifications may be made thereto without departing from the subject matter of the present disclosure set forth in the appended claims, and such modifications fall in the scope of the appended claims.

What is claimed is:

1. A metal oxide nanoparticle, comprising:
   a Zn containing metal Me$^1$ oxide nanoparticle of $Zn_{1-x}Me^1O$ (0≤x≤0.5) composition; and
   a metal Me$^2$ ion surface treatment layer formed on a surface of the Zn containing metal Me$^1$ oxide nanoparticle,
   wherein Me$^1$ is any one selected from Li, Be, Na, Mg, Al, K, Ca, Ti, V, Cr, Mn, Fe, Co, Ni, Cu, Ga, Ge, Rb, Sr, Zr, Nb, Mo, Ru, Rh, Pd, Ag, In, Sn, Sb, Ba, or a combination thereof,
   wherein Me$^2$ is any one selected from Li, Be, Na, Mg, Al, K, Ca, Ti, V, Cr, Mn, Fe, Co, Ni, Cu, Zn, Ga, Ge, Rb, Sr, Zr, Nb, Mo, Ru, Rh, Pd, Ag, In, Sn, Sb, Ba, or a combination thereof,
   wherein the metal Me$^2$ ion surface treatment layer comprises a layer formed by reaction of a metal Me$^2$ ion with a dangling bond on the surface of the Zn containing metal Me$^1$ oxide nanoparticle, and
   wherein the metal oxide nanoparticle comprising the Zn containing metal Me$^1$ oxide nanoparticle and the metal Me$^2$ ion surface treatment layer has an electron mobility lower than that of a metal oxide nanoparticle that contains the Zn containing metal Me$^1$ oxide nanoparticle without the metal Me$^2$ ion surface treatment layer.

2. The metal oxide nanoparticle according to claim 1, wherein the metal Me$^2$ ion surface treatment layer includes Me$^2$-OH.

3. The metal oxide nanoparticle according to claim 1, wherein the metal Me$^2$ ion surface treatment layer is Me$^2$(OH)$_2$.

4. A quantum dot light-emitting device, comprising:
   a hole transport layer, a quantum dot emitting layer and an electron transport layer,
   wherein the electron transport layer comprises a metal oxide nanoparticle comprising:
   a Zn containing metal Me$^1$ oxide nanoparticle of $Zn_{1-x}Me^1O$ (0≤x≤0.5) composition;
   and a metal Me$^2$ ion surface treatment layer formed on a surface of the nanoparticle,
      wherein Me$^1$ is any one selected from Li, Be, Na, Mg, Al, K, Ca, Ti, V, Cr, Mn, Fe, Co, Ni, Cu, Ga, Ge, Rb, Sr, Zr, Nb, Mo, Ru, Rh, Pd, Ag, In, Sn, Sb, Ba, or a combination thereof,
   and wherein Me$^2$ is any one selected from Li, Be, Na, Mg, Al, K, Ca, Ti, V, Cr, Mn, Fe, Co, Ni, Cu, Zn, Ga, Ge, Rb, Sr, Zr, Nb, Mo, Ru, Rh, Pd, Ag, In, Sn, Sb, Ba, or a combination thereof.

5. The quantum dot light-emitting device according to claim 4, further comprising:
   an anode, a hole injection layer and a cathode,
   wherein the hole transport layer and the hole injection layer are any one selected from poly(ethylenedioxythiophene):polystyrene sulphonate (PEDOT:PSS), poly [(9, 9-dioctyl-fluorenyl-2, 7-diyl)-co-(4, 4'-(N-(p-butylphenyl))diphenylamine)] (TFB), poly(9-vinylcarbazole) (PVK), N, N, N, N', N'-tetrakis(4-methoxyphenyl)-benzidine (TPD), poly-TPD, 4, 4', 4''-tris(N-carbazolyl)-triphenylamine (TCTA), N, N'-bis(naphthalen-1-yl)-N, N'bis(phenyl)-9, 9-spiro-bifluorene (spiro-NPB), dipyrazino[2, 3-f:2', 3'-h]quinoxaline-2, 3, 6, 7, 10, 11-hexacarbonitrile (HATCN), 1, 1-bis[(di-4-tolylamino)phenylcyclohexane (TAPC), p-type metal oxide and a combination thereof.

6. The quantum dot light-emitting device according to claim 4, wherein the quantum dot emitting layer comprises Group II-VI, I-III-VI or III-V nano semiconductor compound.

7. The quantum dot light-emitting device according to claim 4, wherein the metal oxide nanoparticle comprises:
a Zn containing Mg oxide nanoparticle of $Zn_{1-x}Mg_xO$ ($0 \leq x \leq 0.5$) composition;
and a Mg ion surface treatment layer formed on a surface of the nanoparticle.

8. The quantum dot light-emitting device according to claim 7, wherein the Mg ion surface treatment layer includes Mg—OH.

9. The quantum dot light-emitting device according to claim 7, wherein the Mg ion surface treatment layer is $Mg(OH)_2$.

10. A method for fabricating the metal oxide nanoparticle of claim 1, comprising:
forming the Zn containing metal $Me^1$ oxide nanoparticle of $Zn_{1-x}Me^1_xO$ ($0 \leq x \leq 0.5$) composition; and
forming the metal $Me^2$ ion surface treatment layer by metal $Me^2$ ion surface treatment on a surface of the Zn containing metal $Me^1$ oxide nanoparticle.

11. The method for fabricating a metal oxide nanoparticle according to claim 10, further comprising providing the Zn containing metal $Me^1$ oxide nanoparticle in a solution, and wherein forming the metal $Me^2$ ion surface treatment layer comprises injecting a precursor of $Me^2$ into the solution to cause reaction.

12. The method for fabricating a metal oxide nanoparticle according to claim 11, wherein the precursor of $Me^2$ is a metal salt material or a metal alkoxide material including $Me^2$.

13. The method for fabricating a metal oxide nanoparticle according to claim 10, wherein forming the Zn containing metal $Me^1$ oxide nanoparticle comprises adding a transparent solution including tetramethylammoniumhydroxide (TMAH) and ethanol to a solution of cation in dimethyl sulfoxide (DMSO) including Zn acetate dehydrate and Mg acetate tetrahydrate to cause reaction, and
wherein forming the metal $Me^2$ ion surface treatment layer by metal $Me^2$ ion surface treatment on the surface of the Zn containing metal $Me^1$ oxide nanoparticle comprises additionally injecting Mg acetate tetrahydrate into the cationic solution to cause further reaction.

14. The method for fabricating a metal oxide nanoparticle according to claim 10, wherein the metal $Me^2$ ion surface treatment layer includes $Me^2$-OH.

15. The method for fabricating a metal oxide nanoparticle according to claim 10, wherein the metal $Me^2$ ion surface treatment layer comprises $Me^2(OH)_2$.

16. The method for fabricating a metal oxide nanoparticle according to claim 10, wherein the metal oxide nanoparticle comprising the Zn containing metal $Me^1$ oxide nanoparticle and the metal $Me^2$ ion surface treatment layer has an electron mobility lower than that of a metal oxide nanoparticle comprising the Zn containing metal $Me^1$ oxide nanoparticle without the metal $Me^2$ ion surface treatment layer.

17. The metal oxide nanoparticle according to claim 1, wherein $Me^1$ is a metal the same as $Me^2$, and wherein a concentration of the metal in the metal $Me^2$ ion surface treatment layer is higher than that in the Zn containing metal $Me^1$ oxide nanoparticle.

* * * * *

UNITED STATES PATENT AND TRADEMARK OFFICE
CERTIFICATE OF CORRECTION

PATENT NO. : 11,870,004 B2
APPLICATION NO. : 16/817162
DATED : January 9, 2024
INVENTOR(S) : Hee-Sun Yang It is certified that error appears in the above-identified patent and that said Letters Patent is hereby corrected as shown below:

In the Specification

At Column 4, Line 46, Delete "$Zn_{0.85}Mg_{0.15}@Mg$" and insert -- $Zn_{0.85}Mg_{0.15}O@Mg$ --.

At Column 4, Line 59, Delete "$Zn_{0.85}Mg_{0.15}@Mg$" and insert -- $Zn_{0.85}Mg_{0.15}O@Mg$ --.

At Column 4, Line 66, Delete "$Zn_{0.85}Mg_{0.15}@Mg$" and insert -- $Zn_{0.85}Mg_{0.15}O@Mg$ --.

At Column 5, Line 5 (approx.), Delete "$Zn_{0.5}Mg_{0.15}@Mg$" and insert -- $Zn_{0.85}Mg_{0.15}O@Mg$ --.

At Column 5, Line 63, Delete "$Zn_{0.9}Mg_{0.10}$" and insert -- $Zn_{0.9}Mg_{0.1}O$ --.

At Column 8, Line 7, Delete "I-II-VI" and insert -- I-III-VI --.

At Column 8, Line 23, Delete "$AsAS_2$," and insert -- $AsAlS_2$, --.

At Column 9, Line 64, Delete "$Zn_{0.85}Mg_{0.15}@Mg$" and insert -- $Zn_{0.85}Mg_{0.15}O@Mg$ --.

At Column 11, Line 35, Delete "(A)" and insert -- (%) --.

At Column 12, Line 23 (approx.), Delete "$Zn_{0.85}Mg_{0.15}@Mg$" and insert -- $Zn_{0.85}Mg_{0.15}O@Mg$ --.

At Column 12, Line 32 (approx.), Delete "$Zn_{0.85}Mg_{0.15}@Mg$" and insert -- $Zn_{0.85}Mg_{0.15}O@Mg$ --.

At Column 12, Line 54 (approx.), Delete "$Zn_{0.85}Mg_{0.5}O@Mg$" and insert -- $Zn_{0.85}Mg_{0.15}O@Mg$ --.

At Column 13, Line 6 (approx.), Delete "(A)" and insert -- (%) --.

At Column 13, Line 41 (approx.), Delete "(A)" and insert -- (%) --.

Signed and Sealed this
Ninth Day of April, 2024

*Katherine Kelly Vidal*

Katherine Kelly Vidal
*Director of the United States Patent and Trademark Office*

CERTIFICATE OF CORRECTION (continued)
U.S. Pat. No. 11,870,004 B2

In the Claims

At Column 14, Line 4 (Claim 1), Delete "$Zn_{1-x}Me^1O$ ($0 \leq x \leq 0.5$)" and insert -- $Zn_{1-x}Me^1_xO$ ($0 \leq x \leq 0.5$) --.

At Column 14, Line 37 (Claim 4), Delete "$Zn_{1-x}Me^1O$ ($0 \leq x \leq 0.5$)" and insert -- $Zn_{1-x}Me^1_xO$ ($0 \leq x \leq 0.5$) --.